United States Patent [19]
Lin et al.

[11] Patent Number: 6,042,996
[45] Date of Patent: Mar. 28, 2000

[54] METHOD OF FABRICATING A DUAL DAMASCENE STRUCTURE

[75] Inventors: Benjamin Szu-Min Lin, Chiayi; Fang-Ching Chao, Hsinchu, both of Taiwan

[73] Assignee: United Microelectronics Corp., Hsin-Chu, Taiwan

[21] Appl. No.: 09/059,071

[22] Filed: Apr. 13, 1998

[30] Foreign Application Priority Data

Feb. 13, 1998 [TW] Taiwan ................................. 87102006

[51] Int. Cl.$^7$ ....................................................... G03F 7/00
[52] U.S. Cl. ............................ 430/313; 430/317; 216/18
[58] Field of Search .................................... 430/313, 314, 430/317, 323, 324, 396; 438/706; 216/17, 18, 49

[56] References Cited

U.S. PATENT DOCUMENTS

| | | | |
|---|---|---|---|
| 5,302,477 | 4/1994 | Dao et al. ................................. | 430/5 |
| 5,741,624 | 4/1998 | Jeng et al. ............................... | 430/312 |
| 5,818,110 | 10/1998 | Cronin .................................... | 257/775 |

*Primary Examiner*—Kathleen Duda

[57] ABSTRACT

A method of fabricating a dual damascene structure is provided comprising forming a photoresist layer on a dielectric layer. A mask including a region that light completely passes over, a region that light partially passes over and a dense region is used for exposure. A development step is carried out to remove the photoresist layer under the region that light completely passes over, to partially remove the photoresist layer under the region that light partially passes over and to leave the photoresist layer under the dense region. The photoresist layer remaining from the forgoing step and the dielectric layer are partially removed to form a via and a trench in the dielectric layer. The via and the trench are filled with metal to form a dual damascene structure.

19 Claims, 4 Drawing Sheets

METHOD OF FABRICATING A DUAL DAMASCENE STRUCTURE

BACKGROUND OF THE INVENTION

1. Field of the Invention

The invention relates in general to the fabrication of semiconductor integrated circuits (ICs), and more particularly to the fabrication of deeper vias and smaller interconnects.

2. Description of the Related Art

When the integration of integrated circuits (IC) increases, the number of interconnections increases. Two or more metal layers are designed for fabricating semiconductor integrated circuits. When the integration continues to increase, it is difficult to make an interconnection with a good yield and a good reliability. Damascene is a method of forming an interconnection. The method first forms a trench for interconnection by etching a dielectric layer. Then the trench is filled with metal to form the interconnection. The method satisfies the need to form high reliability and high yield products. Thus, damascene is the best choice in forming an interconnection in sub-quarter micron processes.

Conventional damascene technology has some problems. One of these is the need for two photolithography steps, making the process more complicated and expensive. The other problem is the difficulty of aligning two masks.

FIGS. 1A–1C are cross-sectional views showing a conventional method of fabricating a dual damascene structure. Referring to FIG. 1A, an oxide layer 12 is formed on a substrate 11 in which a region 10 coupling with a wire is formed. The material of the region 10 coupling with a wire is, for example, metal or silicide. A photolithography step of via etching is performed to form a via 13 coupling with the region 10. In FIG. 1B, a photolithography step of reverse metal etching is performed to form trenches 14 and 15 for interconnection. After the etching is finished, a metal 16 is deposited to fill the via 13, the trenches 14 and 15. The metal 16 overflowing the via 13, trenches 14 and 15 is removed by chemical mechanical polishing (CMP) to form the structure showed in FIG. 1C.

FIGS. 2A–2B are cross-sectional views showing another conventional method of fabricating a dual damascene structure. In this method of fabricating dual damascene structures, a silicon nitride layer is formed as an etching stop layer between oxide layers to decrease the disadvantage of over-etching without the etching stop layer.

Referring to FIG. 2A, a first oxide layer 23 is formed on a substrate 22 in which a region 21 coupling with a wire is formed. A silicon nitride layer 25 with an opening 24 is formed on the first oxide layer 23.

Referring to FIG. 2B, a second oxide layer 26 is formed on the silicon nitride layer 25. Then a photolithography step is performed to form a trench. Since the silicon nitride layer 25 is between the first oxide layer 23 and the second oxide layer 26, trenches 27 and 28 are formed and the etching step stops. Because the silicon nitride layer 25 has the opening 24, the etching step continues to form a via 29. Metal is deposited to fill into the trenches 27 and 28 and the via 29. Metal overflowing the trenches 27 and 28 and the via 29 is removed by CMP. Then, the back-end process is performed.

Although the method described above can control the depth of a trench, the method still has some problems. One of the problems is that the silicon nitride layer as an etching stop layer has a high dielectric constant k. The high dielectric constant k increases the parasitic capacitance between interconnections. Furthermore, an etchant used in the photolithography step must have high selectivity of silicon nitride/silicon dioxide. Another of the problems is that the process window is narrow. The etching area shifts when the mask misaligns during etching.

To illustrate this problem, FIG. 3 shows a first oxide layer 32, a silicon nitride layer 33 with a opening and a second oxide layer 34 formed in sequence on a substrate 31 in which a region 30 coupling with a wire is formed. A photolithography step is proceeded by using a mask that shifts towards the right. The shifting of the etching area forms a trench 35 with the same size and a small via 36. When a metal is formed into the trench 35 and the via 36, the contact area that the metal couples with the region 30 is decreased. The decreasing of the contact area makes the contact resistance of interconnections increase. The process has a narrow window and is performed with difficulty.

SUMMARY OF THE INVENTION

It is therefore an object of the invention to provide a method of fabricating a dual damascene structure. The method only needs one photolithography step and doesn't have the shift problem produced by the conventional method which uses two masks. The method also reduces the steps and decreases the cost.

The invention achieves the above-identified objects by providing a method of fabricating a dual damascene structure. First, a plurality of devices is formed on a semiconductor substrate. Then, a dielectric layer is formed on the devices and the semiconductor substrate. A photoresist layer is formed on the dielectric layer. A exposure step is carried out by using a mask. The mask has three parts including a region light completely passes over, a transmissive region and a opaque region. A development step is carried out after the exposure step. Part of the photoresist layer under partially transmissive region is removed to expose the surface of the dielectric layer. Part of the photoresist layer under partially transmissive region is partially removed and the other photoresist layer under the opaque region is left. The dielectric layer is etched by anisotropic etching through the photoresist layer remaining on the dielectric layer. Because the etching rates of the photoresist layer and of the dielectric layer are close, the photoresist layer is partially removed during the etching of the dielectric layer. The dielectric layer under the transmissive region is removed to form a via coupling with one of the devices. The dielectric layer under the transmissive region is etched to form a trench. The method described above makes a dual damascene structure with a via and a trench formed in sequence.

BRIEF DESCRIPTION OF THE DRAWINGS

Other objects, features, and advantages of the invention will become apparent from the following detailed description of the preferred but non-limiting embodiments.

The description is made with reference to the accompanying drawings in which.

DESCRIPTION OF THE PREFERRED EMBODIMENT

Figure 1A:
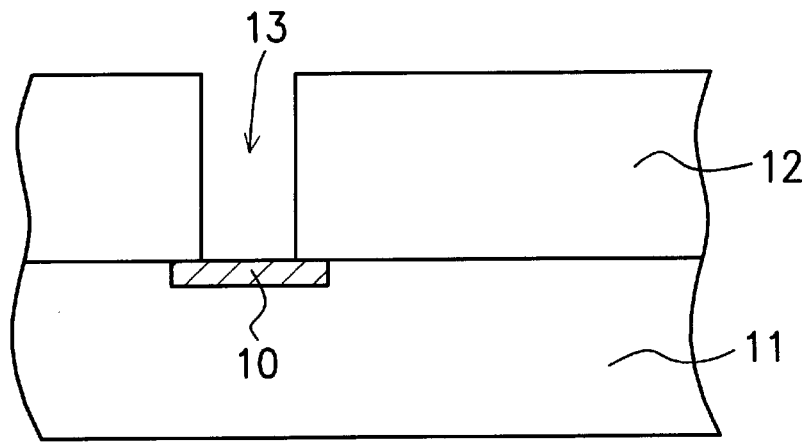
FIGS. 1A–1C are cross-sectional views showing a conventional method of fabricating a dual damascene structure.
Figure 1B:
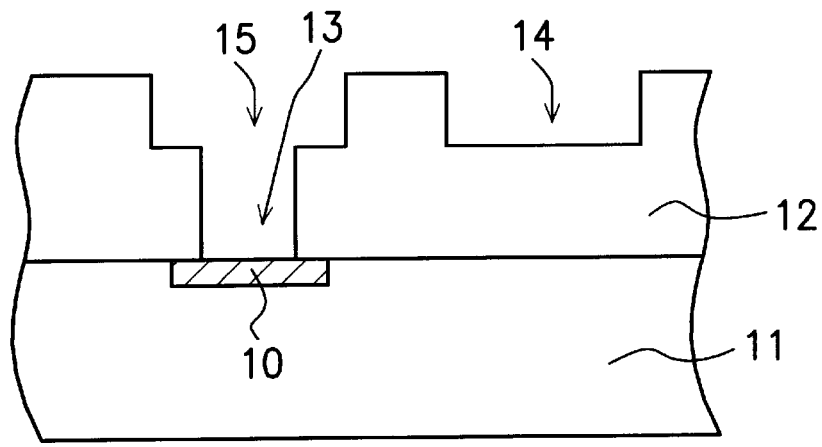
Figure 1C:
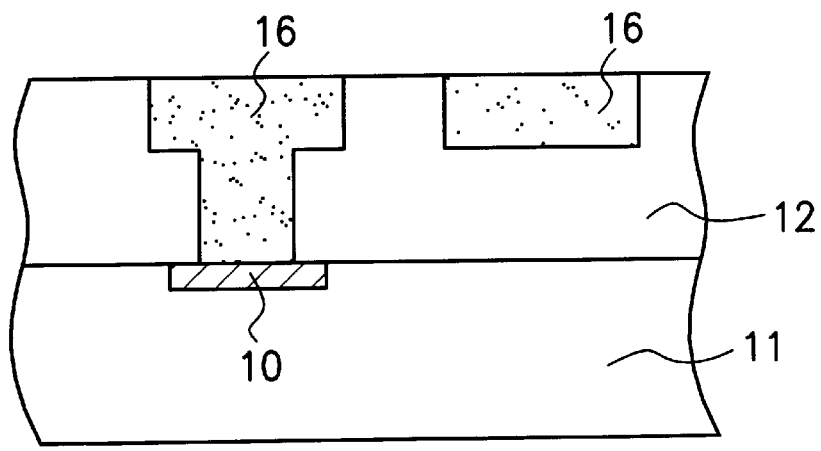
Figure 2A:
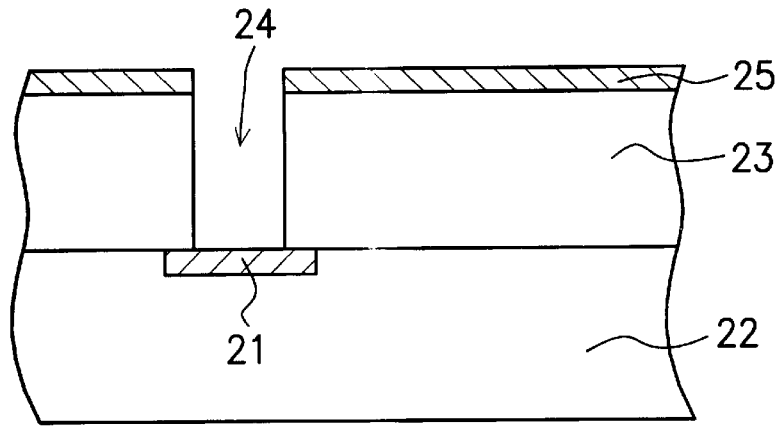
FIG. 2A and FIG. 2B are cross-sectional views showing another conventional method of fabricating a dual damascene structure.
Figure 2B:
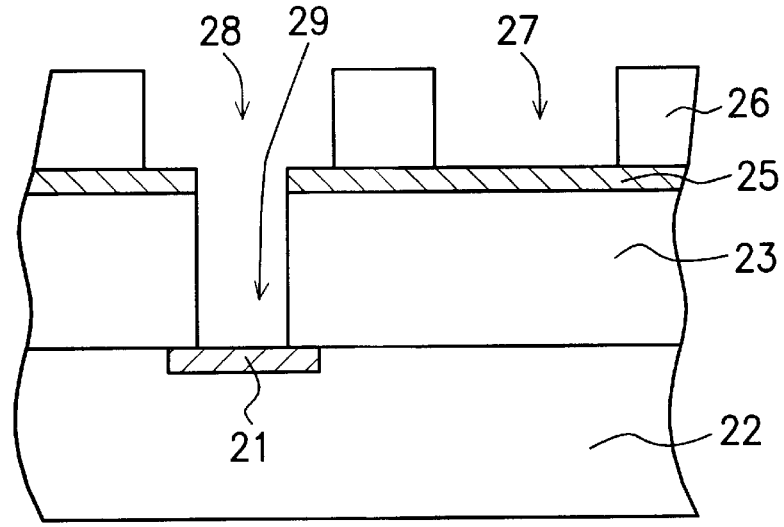
Figure 3:
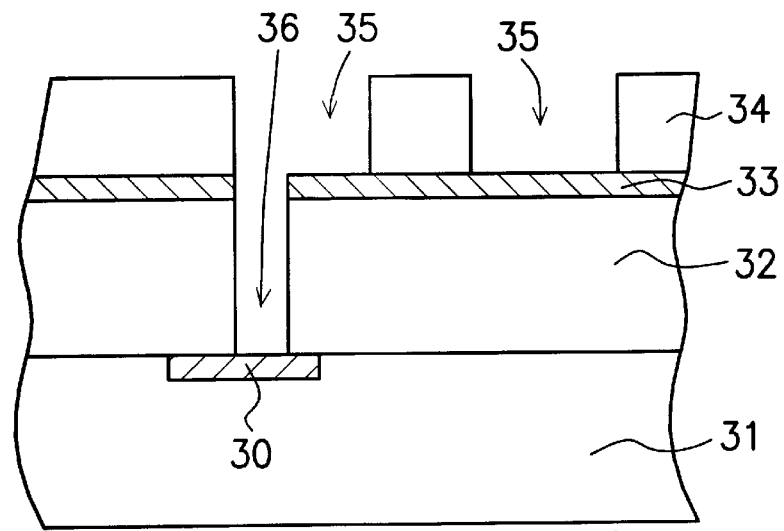
FIG. 3 is a cross-sectional view showing a shift of a mask by using a conventional method of fabricating a dual damascene structure.
Figure 4A:
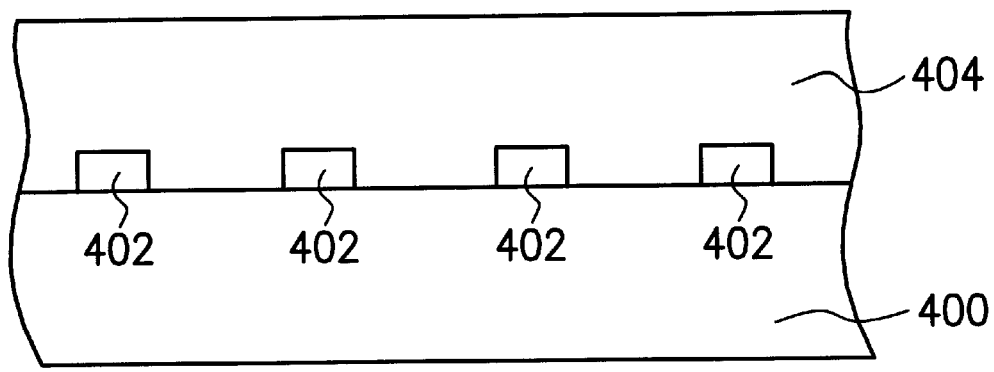
FIGS. 4A–4E are cross-sectional views showing the process steps of one preferred embodiment of this invention.

Referring first to FIG. 4A, a semiconductor substrate 400 is provided. Several devices 402 are formed on the semiconductor substrate 400. A dielectric layer 404 is formed on the devices 402 and the semiconductor substrate 400. The semiconductor substrate 400 may have a first interconnection on it (not shown). The devices 402 are, for example, patterned metal lines formed on a planarization borophosphsilicate glass (BPSG).

Figure 4B:
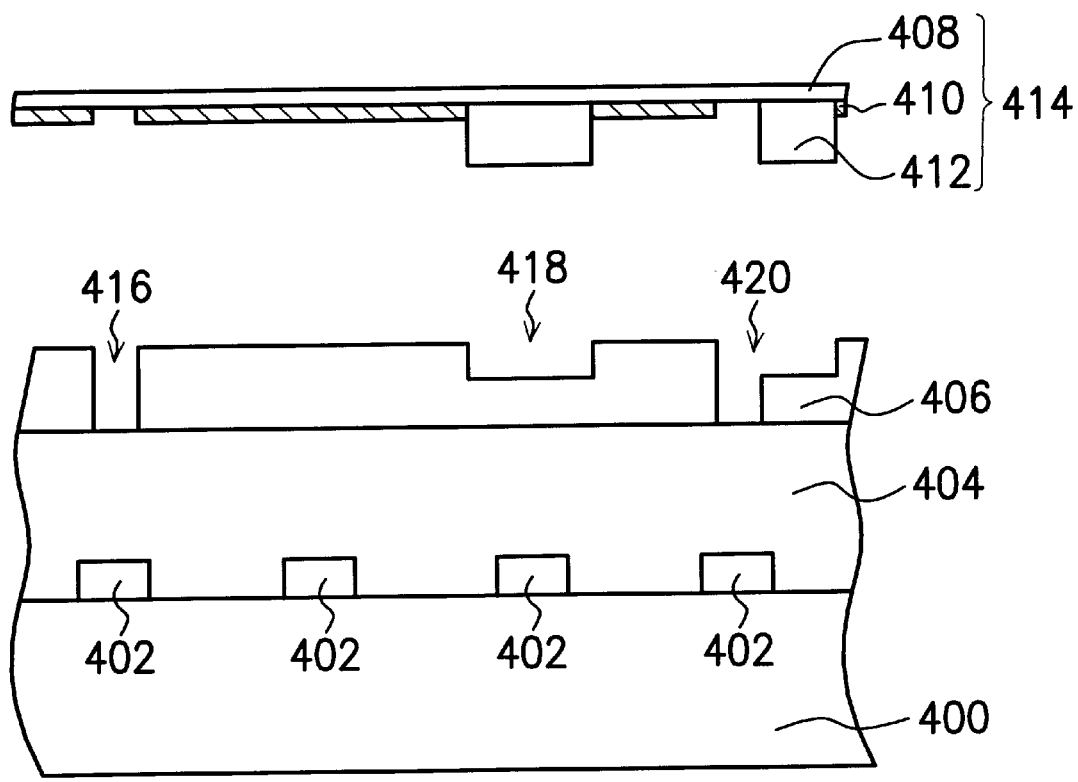

Referring to FIG. 4B, a photoresist layer 406 is formed on the dielectric layer 404. An exposure step is carried on the photoresist layer 406 through a mask 414. The mask 414 has three parts including a transmissive region 408, an opaque region 410 and a partially transmissive region 412. The material of the dense region 410 is, for example, chromium. The material of the partially transmissive region 412 is, for example, chromic oxide, silicon-oxy-nitride or molybdic silicide. A development step is carried out after exposure. A part of the photoresist layer 406 under the transmissive region 408 is removed to form a hole 416 and expose the top surface of the dielectric layer 404. Another part of the photoresist layer 406 under the region 412 that light partially passes over is partially removed to form a pit 418 in the photoresist layer 406. The other part of the photoresist layer 406 under the opaque region 410 is left after development. There is a pattern 420 comprising a pit and a hole in the photoresist layer 406 formed by using the transmissive region 408 and the partially transmissive region 412.

Figure 4C:
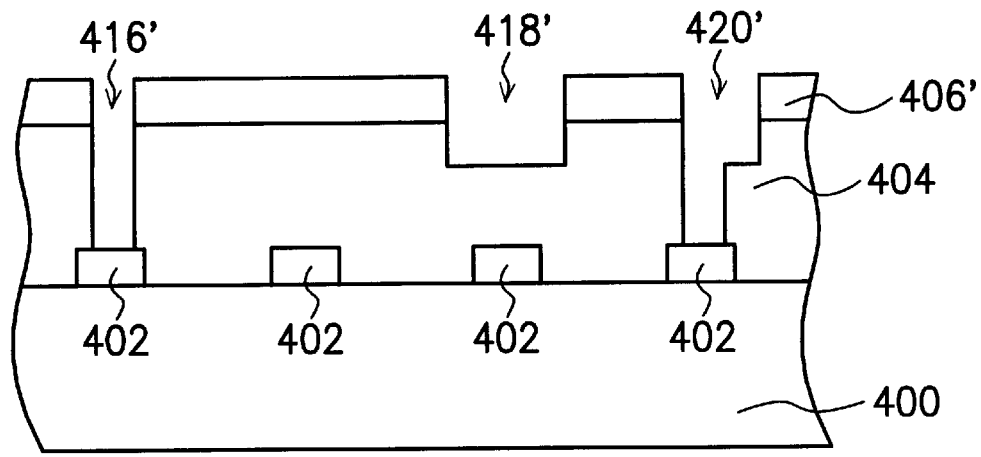

Referring to FIG. 4C, the mask 414 is removed. The dielectric layer 404 is etched, for example, by anisotropic etching through the photoresist layer 406 after development. An etchant used in the etching step has low selectivity of etching for the photoresist layer 406 and the dielectric layer 404. This means the etching rate of the photoresist layer 406 and of the dielectric layer 404 are about the same. Thus, the photoresist layer 406 is etched at the same time the dielectric layer 404 is etched. A part of the dielectric layer 404 under the hole in the photoresist layer 406 is completely removed to form a via 416' coupling with one of the devices 402. Simultaneously, another part of the dielectric layer 404 under the pit 418 in the photoresist layer 406 is partially removed to form a trench 418' in the dielectric layer 404 because there is a thinner photoresist layer 406 over the dielectric layer 404. In addition, the dielectric layer 404 is etched through the pattern 420 comprising a pit and a hole in the photoresist layer 406 to form a profile 420' comprising a via and a trench. The photoresist layer 406 is partially removed during etching to leave a thinner photoresist layer 406' on the dielectric layer 404.

Figure 4D:
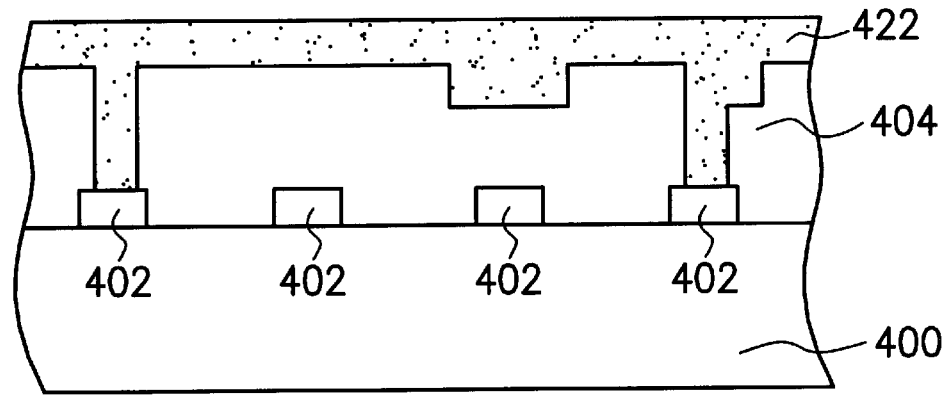

Referring to FIG. 4D, the thinner photoresist layer 406' remaining on the dielectric layer is removed after etching to expose the dielectric layer 404. A conductive layer 422 is formed on the dielectric layer 404. The material of the conductive layer 422 is, for example, aluminum, copper or Al—Cu alloy.

Figure 4E:
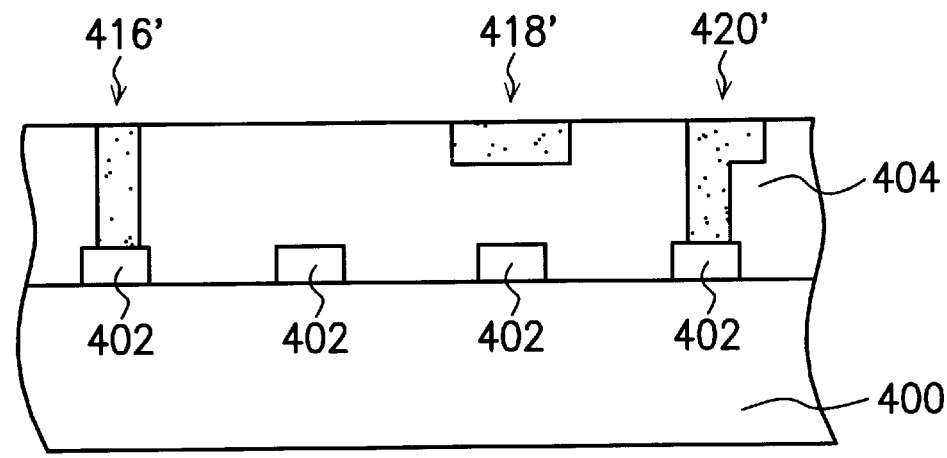

Referring to FIG. 4E, the conductive layer is partially removed, for example, by CMP to expose the planar surface of the dielectric layer 404. A conductive material fills into the via 416', the trench 418' and the profile 420'.

This invention provides a method only using one photolithography step. The step uses a mask to make the photoresist layer have different levels of development whereby a via and a trench are formed in sequence. The mask has different regions where the levels of light passing through the mask are different. This invention only uses one mask, thus reducing the steps and decreasing the cost.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating dual damascene structures, comprising the steps of:

providing a semiconductor substrate, wherein the semiconductor substrate has a plurality of devices and a dielectric layer on the devices;

forming a photoresist layer on the dielectric layer;

exposing the photoresist layer through a mask;

simultaneously etching the photoresist layer and the dielectric layer using an etchant to simultaneously form at least a trench and a via in the dielectric layer, wherein the via couples with one of the devices;

removing the photoresist layer remaining on the dielectric layer;

forming a conductive layer into the trench, the via and on the dielectric layer; and partially removing the conductive layer to expose the surface of the dielectric layer.

2. A method according to claim 1, wherein the etching rate of the photoresist layer and the etching rate of the dielectric layer are about the same.

3. A method according to claim 1, wherein the mask comprises a transmissive region, a partially transmissive region, and an opaque region.

4. A method according to claim 3, wherein the opaque region of the mask is chromium.

5. A method according to claim 3, wherein the partially transmissive region is silicon-oxy nitride.

6. A method according to claim 3, wherein the partially transmissive region is chromic oxide.

7. A method according to claim 3, wherein the partially transmissive region is molybdic silicide.

8. A method according to claim 1, wherein the trench and the via are formed by anisotropic etching.

9. A method according to claim 1, wherein the conductive layer is a metal.

10. A method according to claim 1, wherein the step of partially removing the conductive layer is performed by chemical mechanical polishing.

11. A method of fabricating dual damascene structures, comprising the steps of:

providing a semiconductor substrate;

forming a plurality of devices on the semiconductor substrate;

forming a dielectric layer on the devices and the semiconductor substrate;

forming a photoresist layer on the dielectric layer;

exposing the photoresist layer through a mask, wherein the mask comprises a transmissive region, a partially transmissive region and an opaque region;

forming a first region of the photoresist layer under the transmissive region, forming a second region of the photoresist layer under the partially transmissive region and forming a third region of the photoresist layer under the opaque region;

simultaneously etching the photoresist layer and the dielectric layer to simultaneously form at least a via coupling with one of the devices and a trench in the dielectric layer by etching the dielectric layer through the photoresist layer;

removing the photoresist layer remaining on the dielectric layer;

forming a conductive layer over the substrate to fill the via and the trench; and partially removing the conductive layer to expose the surface of the dielectric layer.

12. A method according to claim 11, wherein the etching rate of the photoresist layer and the etching rate of the dielectric layer are about the same.

13. A method according to claim 11, wherein the opaque region of the mask is chromium.

14. A method according to claim 11, wherein the partially transmissive region is silicon-oxy nitride.

15. A method according to claim 11, wherein the partially transmissive region is chromic oxide.

16. A method according to claim 11, wherein the partially transmissive region is molybdic silicide.

17. A method according to claim 11, wherein the trench and the via are formed by anisotropic etching.

18. A method according to claim 11, wherein the conductive layer is a metal.

19. A method according to claim 11, wherein the step of partially removing the conductive layer is performed by chemical mechanical polishing.

* * * * *